United States Patent
Manian (10) Patent No.: US 11,239,834 B2
(45) Date of Patent: *Feb. 1, 2022

(54) CLOCKLESS DELAY ADAPTATION LOOP FOR RANDOM DATA

(71) Applicant: Texas Instruments Incorporated, Dallas, TX (US)

(72) Inventor: Abishek Manian, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/119,050

(22) Filed: Dec. 11, 2020

(65) Prior Publication Data

US 2021/0152165 A1 May 20, 2021

Related U.S. Application Data (63) Continuation of application No. 16/687,147, filed on Nov. 18, 2019, now Pat. No. 10,897,245.

(51) Int. Cl.
| | |
|---|---|
| *H03L 7/06* | (2006.01) |
| *H03K 5/14* | (2014.01) |
| *H03K 5/15* | (2006.01) |
| *H03K 19/21* | (2006.01) |
| *H03K 5/06* | (2006.01) |
| *H03K 5/00* | (2006.01) |

(52) U.S. Cl.
CPC ............. *H03K 5/14* (2013.01); *H03K 5/06* (2013.01); *H03K 5/1504* (2013.01); *H03K 19/215* (2013.01); *H03K 2005/00045* (2013.01)

(58) Field of Classification Search
CPC ...... H03K 5/14; H03K 5/1504; H03K 19/215; H03K 5/06; H03K 2005/00045
USPC ........................................................ 327/158
See application file for complete search history.

(56) References Cited

U.S. PATENT DOCUMENTS

| | | | |
|---|---|---|---|
| 5,570,052 A | 10/1996 | Fonderie et al. | |
| 6,680,634 B1* | 1/2004 | Ruha | H03L 7/0812 327/149 |
| 9,231,793 B1* | 1/2016 | Vareljian | H04L 25/03057 |
| 9,552,003 B2 | 1/2017 | Madsen et al. | |
| 10,236,897 B1 | 3/2019 | Manian et al. | |
| 10,897,245 B1* | 1/2021 | Manian | H03K 19/215 |
| 2010/0098147 A1* | 4/2010 | Miller | H04L 25/03057 375/233 |
| 2010/0283520 A1 | 11/2010 | Ku | |
| 2010/0295588 A1 | 11/2010 | Choi | |
| 2016/0134292 A1* | 5/2016 | Wu | H03K 5/159 365/185.18 |

OTHER PUBLICATIONS

International Search Report in corresponding PCT Application No. PCT/US2020/061021, dated Feb. 18, 2021 (2 pages).

* cited by examiner

*Primary Examiner* — Metasebia T Retebo
(74) *Attorney, Agent, or Firm* — John R. Pessetto; Charles A. Brill; Frank D. Cimino (57) ABSTRACT

An apparatus includes a clockless delay adaptation loop configured to adapt to random data. The apparatus also includes a circuit coupled to the clockless delay adaptation loop. The clockless delay adaptation loop includes a cascaded delay line and an autocorrelation control circuit coupled to the cascaded delay line, wherein an output of the autocorrelation control circuit is used to generate a control signal for the cascaded delay line.

11 Claims, 7 Drawing Sheets

CLOCKLESS DELAY ADAPTATION LOOP FOR RANDOM DATA

CROSS-REFERENCE TO RELATED APPLICATION(S)

This continuation application claims priority to U.S. patent application Ser. No. 16/687,147, filed Nov. 18, 2019, which is incorporated herein by reference in its entirety.

BACKGROUND

The proliferation of networked electronic devices continues along with related efforts to increase signaling speed while maintaining signal integrity. The core of a communication link consists of a transmitter that generates the signal, a channel that carries the signal and a receiver that accepts the signal and processes it correctly. Signals can be carried by channels as electrical signals, optical pulses, or electromagnetic signals. For accurate signaling between networked devices or components, the integrity of the signal needs to be maintained. From a physical layer standpoint, this means that if a "1" is sent from the transmitter and down the channel, be it copper, optical fiber or air, the receiver should also determine that the signal is a "1". This is a fundamental challenge for data transmission system and circuit designers due to the various factors affecting signal integrity.

Signal integrity in data transmission systems is affected by a number of factors. Apart from random noise, atmospheric and man-made noise, there are deterministic factors that contribute to deteriorating signal integrity. Copper-based signal transmission is affected by the limited bandwidth of copper channels and crosstalk from adjacent channels. Optical signals are affected by frequency-independent loss of optical power as they travel down the fiber as well as dispersion-causing mechanisms depending on the type of fiber. Bandwidth limitations in copper and pulse dispersion in optical fibers result in inter-symbol-interference (ISI) at the receiver. Typically, ISI deteriorates as the data rate and the length of the channel increases. ISI is the primary factor limiting transmission distances over copper-based transmission channels and optical fiber at high data-rates (e.g., 10-Gb/sec). Efforts to compensate for ISI and otherwise maintain signal integrity has resulted in various transmitter-side and receiver-side technologies, including equalization.

Equalization is a process of conditioning the electrical signal, either at the transmitter or the receiver to compensate for channel-induced ISI and improve signal integrity. Linear and non-linear equalization techniques have been explored in the literature. One non-linear equalization technique is referred to as decision-feedback equalization (DFE). In DFE, a delay element is introduced into the receiver circuitry and equalization values are combined with an input data stream.

In many applications (e.g., re-drivers), a clock is not available and thus a clockless delay line (to delay the random data) is needed. The delay needs to be adapted automatically to 1 unit interval (UI) or multiples of 1 UI for a range of permissible data rates. Delay adaptation for different data rates is not trivial and issues such as cost, power efficiency, and footprint size need to be considered. Efforts to improve DFE design and account for different data rates are ongoing.

SUMMARY

In accordance with at least one example of the disclosure, an apparatus comprises a clockless delay adaptation loop configured to adapt to random data. The apparatus also comprises a circuit coupled to the clockless delay adaptation loop. The clockless delay adaptation loop comprises a delay line with a data input node, a data output node, and a control input node. The clockless delay adaptation loop also comprises an autocorrelation control circuit coupled to the cascaded delay line, wherein an output of the autocorrelation control circuit is used to generate a control signal for the cascaded delay line.

In accordance with at least one example of the disclosure, a clockless decision-feedback equalizer (DFE) comprises a summation circuit configured to provide an output signal by combining an input signal and a feedback signal. A DFE feedback path configured to receive the output signal and provide the feedback signal, wherein the DFE feedback path includes a delay adaptation loop configured to adapt to random data. The delay adaption loop comprises a voltage-controlled delay line (VCDL) with a data input node, a data output node, and a control input node. The delay adaptation loop also comprises an autocorrelator coupled to the data input node and the data output node, wherein an output of the autocorrelator is used to generate a control signal input to the control input node. The delay adaptation loop also comprises a DFE tap circuit in series with the VCDL.

In accordance with at least one example of the disclosure, a delay adaptation loop comprises a first delay line and a second delay line. The delay adaption loop also comprises an autocorrelation control circuit coupled to the first delay line and the second delay line. The autocorrelation control circuit provides a control signal to each of the first and second delay lines based on an autocorrelation function applied to input data and output data of at least one of the first and second delay lines.

BRIEF DESCRIPTION OF THE DRAWINGS

For a detailed description of various examples, reference will now be made to the accompanying drawings in which.

DETAILED DESCRIPTION

Disclosed herein are delay adaptation loop topologies that employ an autocorrelation function. The autocorrelation function of a random data stream decreases monotonically as the delay shift is increased from zero delay, and goes to zero when the time shift reaches and exceeds 1 unit interval (UI). In the presence of inter-symbol interference (ISI), the autocorrelation function may have a non-zero tail that exceeds a time shift of 1 UI. So instead of locking to 1 UI, a more robust option involves locking to 0.5 UI by forcing the autocorrelation function towards 0.5 (instead of 0). As desired, one or more 0.5-UI delay elements are cascaded to generate the 1-UI delay. As described herein, example delay elements include voltage-controlled delay lines (VCDLs) and a decision-feedback equalization (DFE) tap circuit, where VCDLs have an adjustable delay and the DFE tap circuit has a fixed delay.

In some examples, a delay adaptation loop includes a VCDL with a data input node, a data output node, and a control input node. The delay adaptation loop also includes an autocorrelator coupled to the data input node and the data output node of the VCDL. The delay adaptation loop also includes a transconductance ($G_m$) stage coupled to the autocorrelator, wherein the transconductance stage is configured to convert a voltage corresponding to a portion (e.g., 0.5) of an autocorrelator output into a current. The delay adaptation loop also includes a capacitor with a first (e.g., top) plate coupled to an output of the transconductance stage and with a second (e.g., bottom) plate coupled to a ground node. The output of the transconductance stage is also coupled to the control input node of the VCDL to lock the VCDL to a value of less than 1 UI. As desired, additional VCDLs and/or a DFE tap circuit are coupled to the output of the transconductance stage. In other examples, a delay adaptation loop includes multiples VCDLs and an autocorrelator for each VCDL. In such case, the autocorrelator outputs are used separately (e.g., separate transconductance stages are used) or are combined (e.g., a single transconductance stage are used).

In some examples, the delay adaptation loop is employed in a clockless decision-feedback equalizer (DFE). Also, in different examples, the clockless DFE is part of a linear repeater or redriver circuit. With the disclosed delay adaptation loop, a delay locked loop is able to adapt to 1 UI delay (or some multiple of 0.5 UI) for random data without the need for any clock in the system. To provide a better understanding, various delay adaptation loop options, system options, autocorrelation options, and related circuits are described using the figures as follows.

Figure 1:
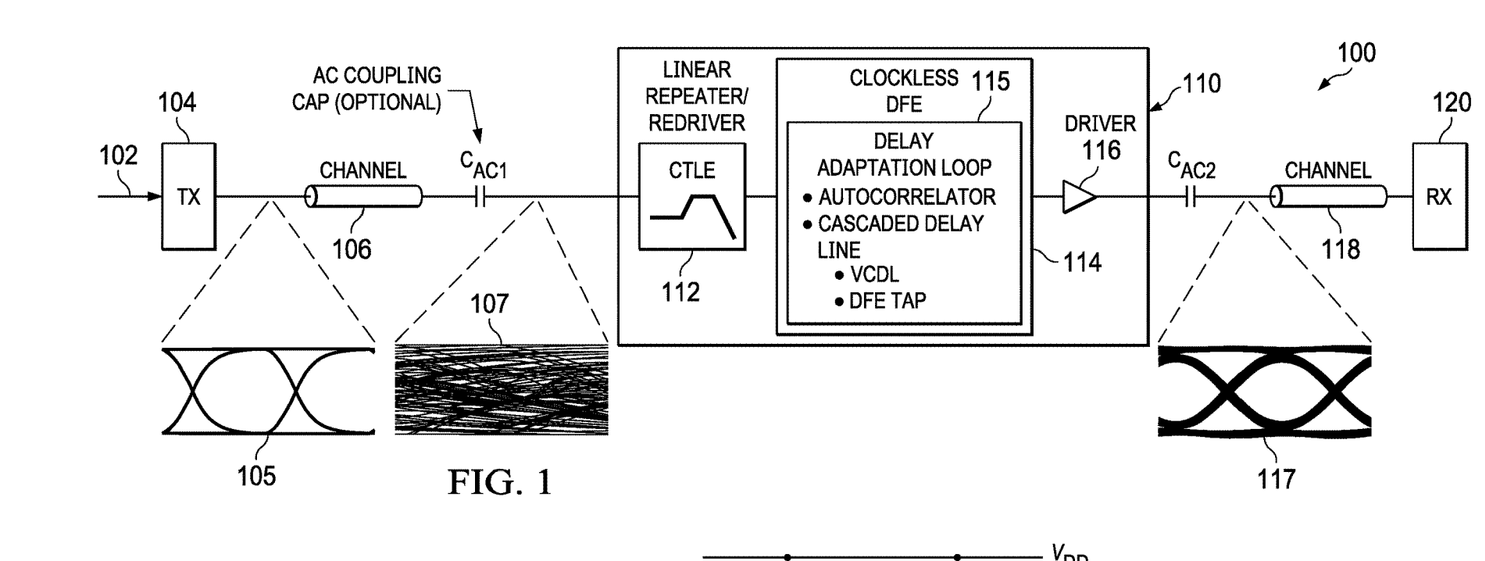
FIG. 1 is a diagram showing a communication system in accordance with some examples.

FIG. 1 is a diagram showing a communication system 100 in accordance with some examples. As shown, the system 100 includes a transmitter 104, a channel 106, a linear repeater or redriver 110, a channel 118, and a receiver 120. In some examples, the communication system includes AC couple capacitors ($C_{AC1}$ and $C_{AC2}$) before and after the linear repeater or redriver 110. In FIG. 1, source data 102 is output from the transmitter 104 and is represented by transmitted signal eye diagram 105. After conveyance via the channel 106, the source data 102 is no longer distinguishable as represented by the received signal eye diagram 107. The operation of the linear repeater or redriver 110 is to recover the source data 102 transmitted by the transmitter 104 and to repeat the same signal using a driver 116, where the data transmitted by the driver 116 is represented by the transmitted signal eye diagram 117. The repeated data is transmitted by the driver 116 to the channel 118. In the example of FIG. 1, the linear repeater or redriver 110 recovers the data using a continuous time linear equalizer (CTLE) 112 and a clockless DFE loop 114. In the example of FIG. 1, the DFE loop 114 includes a delay adaptation loop 115 with an autocorrelator and a cascaded delay line as described herein. In some examples, the cascaded delay line includes at least one VCDL and a DFE tap circuit. The equalization operations of the CTLE 112 and the clockless DFE 114 facilitate recovery of the source data 102.

More specifically, the channel 106 represents one or more physical transmission mediums (e.g., wires, air, optical fiber, etc.) used to convey signals between the transmitter 104 and the linear repeater or redriver 110. In operation, the transmitter 104 receives the source data 102 and conveys a signal representing the source data 102 to the channel 106. The linear repeater or redriver 110 operates to receive signals from the channel 106, to recover the source data 102, and to pass the recovered data linearly to another communication link.

Recovering the source data 102 at the linear repeater or redriver 110 involves various operations, including those performed by the clockless DFE loop 114. The operations of the clockless DFE loop 114 include briefly delaying and modifying receiver-side signals, resulting in "equalized" signals, which are then used by the driver 116 to generate a new signal that matches the source data 102. With the clockless DFE loop 114, higher-speed signaling due to a reduction in intersymbol interference (ISI) is possible.

Figure 2:
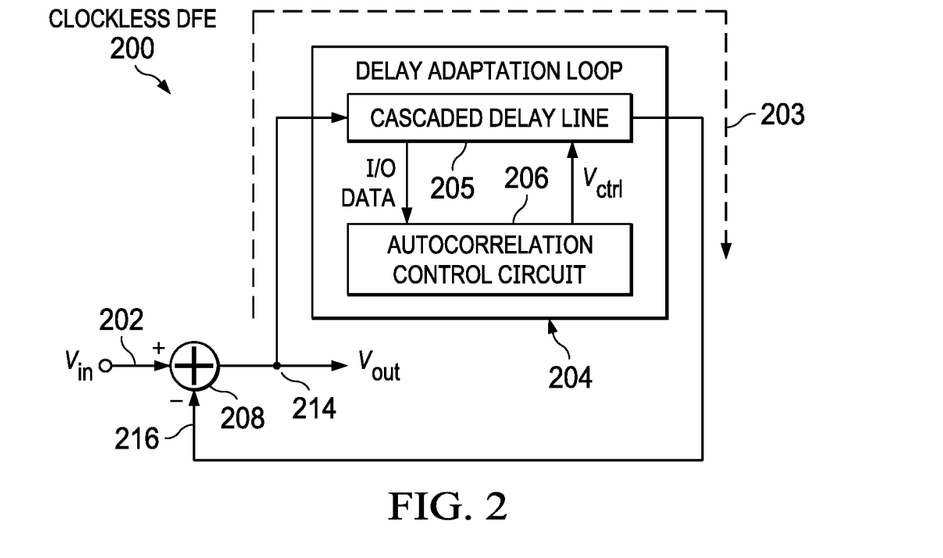
FIG. 2 is a diagram showing a clockless decision feedback equalization (DFE) loop in accordance with some examples.

FIG. 2 is a diagram showing a clockless DFE loop 200 in accordance with some examples. As shown, the clockless DFE loop 200 includes a summation circuit 208 configured to provide an output signal 214 by combining an input signal 202 and a feedback signal 216. The clockless DFE loop 200 also comprises a delay adaptation loop 204 configured to adapt to random data. In the example of FIG. 2, the delay adaptation loop 204 receives the output signal 214 as an input and provides the feedback signal 216 as an output. As shown, the delay adaptation loop 204 includes an autocorrelation control circuit 206 and a cascaded delay line 206, where the autocorrelation control circuit 206 receives input/output data from the cascaded delay line 206 and provides at least one control signal (e.g., $V_{ctrl}$, $V_{ctrl1}$, $V_{ctrl2}$) to the cascaded delay line 206. In different examples, the autocorrelation control circuit 206 varies with regard to the number of autocorrelators and/or other components used to generate at least one control signal (e.g., $V_{ctrl}$, $V_{ctrl1}$, $V_{ctrl2}$). In operation, the autocorrelation control circuit 206 correlates input/output (I/O) data related to at least one of the delay lines of a cascaded delay line 205. The correlation results are used to generate at least one control signal (e.g., $V_{ctrl}$, $V_{ctrl1}$, $V_{ctrl2}$), which is provided to the delay lines of the cascaded delay line 205. In some examples, the cascaded delay line 205 includes a single VCDL and a DFE tap circuit (a delay line with a fixed delay with a programmable output swing) configured to generate the feedback signal by applying signed DFE tap weights to a delayed version of the output signal 214. In other examples, the cascaded delay line 205 includes a series of VCDLs as well as a DFE tap circuit configured to apply signed DFE tap weights to a delayed version of the output signal 214.

Figure 3A:
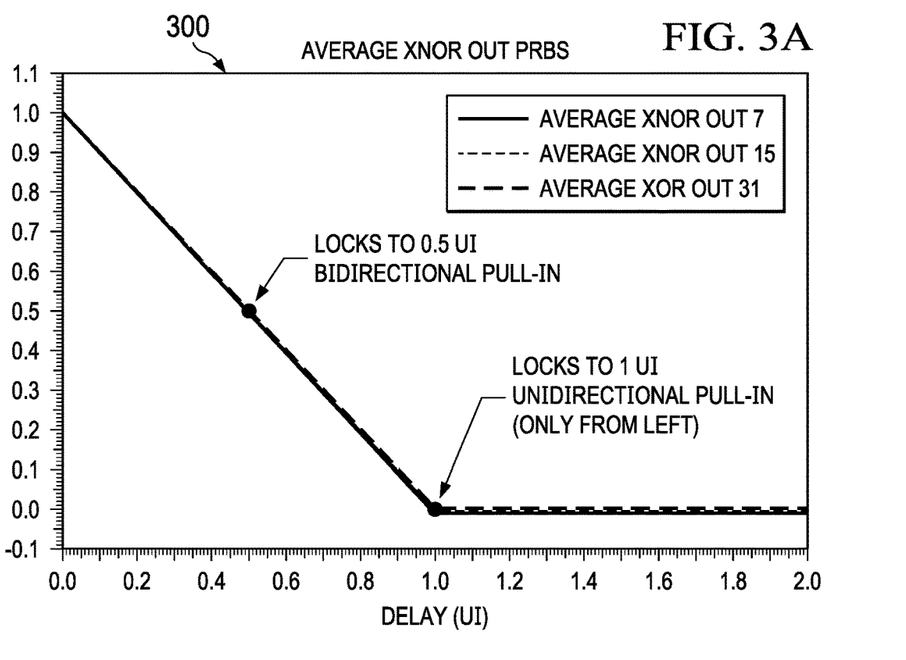
FIG. 3A is a graph showing autocorrelation using an XNOR gate without inter-symbol interference (ISI)

FIG. 3A is a graph 300 showing autocorrelation using an XNOR gate without inter-symbol interference (ISI). The autocorrelation function of a real signal f(t) is given by:

$$R_f(\tau) = \lim_{T \to \infty} \frac{1}{2T} \int_{-T}^{T} f(t) f(t - \tau) dt.$$

For a random non-return-to-zero (NRZ) bit stream, the autocorrelation function is a triangular function as shown on the right that goes to (and stays at) zero at (beyond) 1 UI. For a random NRZ bit stream, an XNOR gate (output: ±1 V) is usable as an autocorrelator.

Figure 3B:
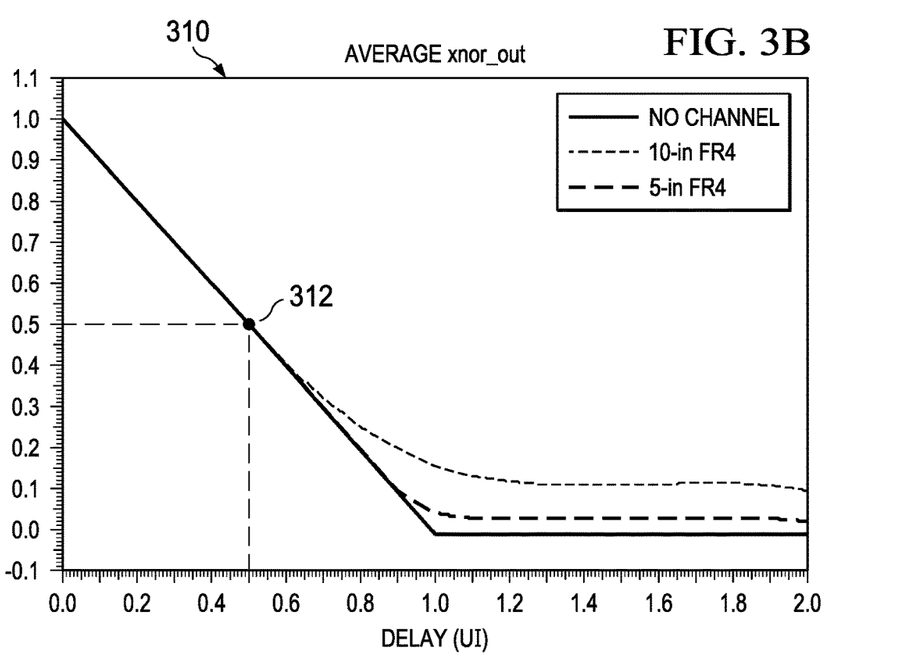
FIG. 3B is a graph showing autocorrelation using an XNOR gate with ISI.

FIG. 3B is a graph 310 showing autocorrelation using an XNOR gate with ISI. In the presence of ISI, the tail spreads as shown in graph 310, but the 0.5 UI point 312 does not shift much. Hence, one proposed strategy involves comparing the average XNOR gate output (output: ±1 V) to 0.5 V and locking the delay to 0.5 UI.

Figure 4:
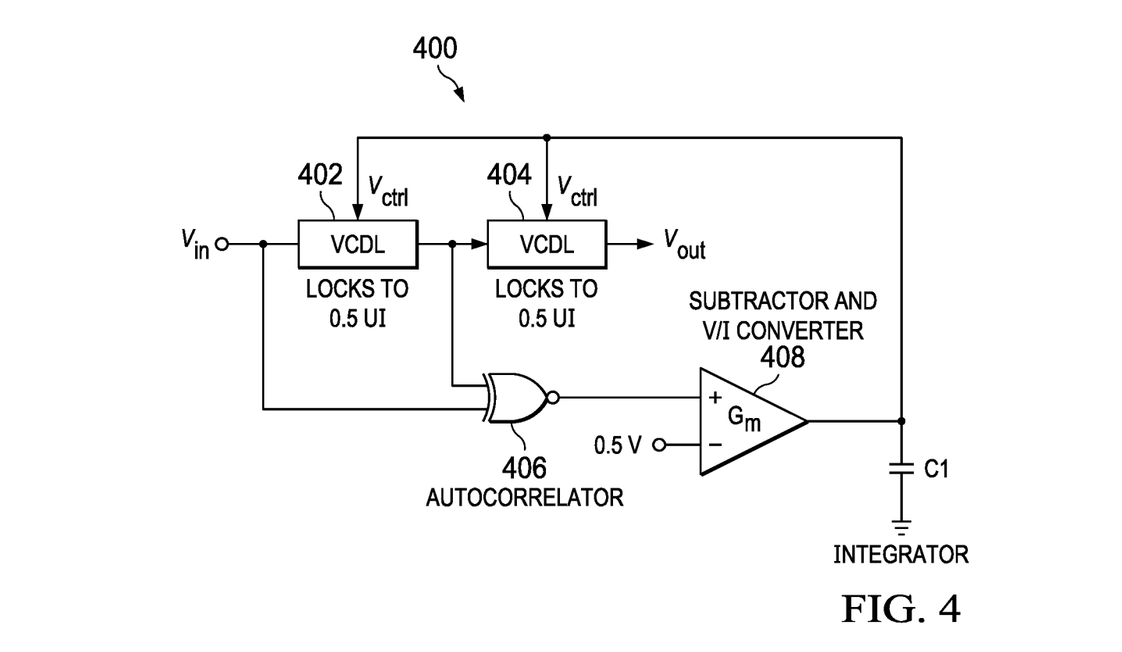
FIG. 4 is a diagram of a delay adaptation loop in accordance with some examples.

FIG. 4 is a diagram of a delay adaptation loop 400 in accordance with some examples. The delay adaptation loop 400 is an example of the delay adaption loop 204 in FIG. 2, which is part of a clockless DFE. In other examples, the delay adaption loop 400 is used in a clockless feedforward equalizer (FFE), a loss of lock detector, and other such applications across data rates. As shown, the delay adaptation loop 400 includes a VCDL 402 in series with a VCDL 404, which form a cascaded delay line (e.g., the cascaded delay line 205 in FIG. 2). The delay adaption loop 400 also includes an autocorrelator 406 coupled to the input and output of the VCDL 402. In the example of FIG. 4, the autocorrelator 406 is a XNOR gate, which correlates the input and output of the VCDL 402. In some examples, the average autocorrelator output is set to 0.5 using a transconductance stage 408 that subtracts 0.5V from the output of the autocorrelator 406. The output of the transconductance stage 408 is used to charge a capacitor (C1), which determines $V_{ctrl}$. In the example of FIG. 4, $V_{ctrl}$ is provided as a control signal to the VCDL 402 and 404, which locks the delay for each of the VCDLs 402 and 404 at 0.5 UI (resulting in a total delay of 1 UI for the delay adaptation loop of FIG. 4). In FIG. 4, the autocorrelator 406, the transconductance stage 408, and C1 correspond to an autocorrelation control circuit (e.g., the autocorrelation control circuit 206 of FIG. 2).

Figure 5:
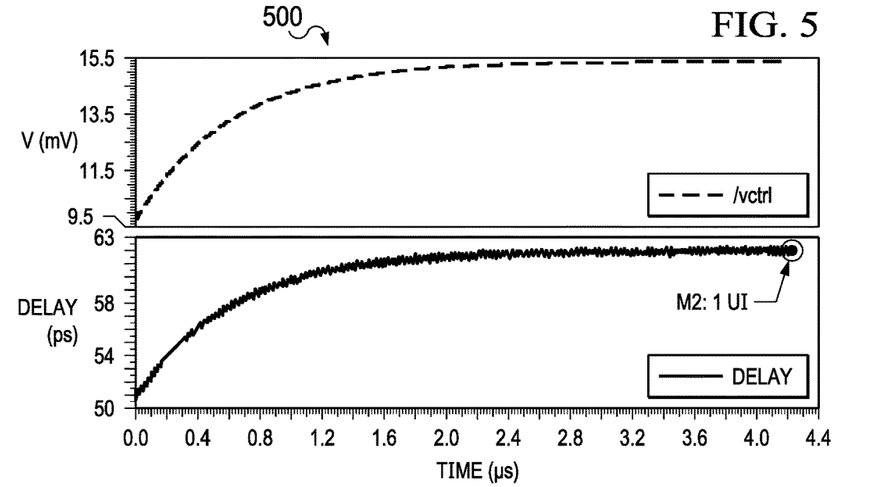
FIG. 5 is a graph showing delay and control voltage ($V_{ctrl}$) curves in accordance with some examples.
Figure 6A:
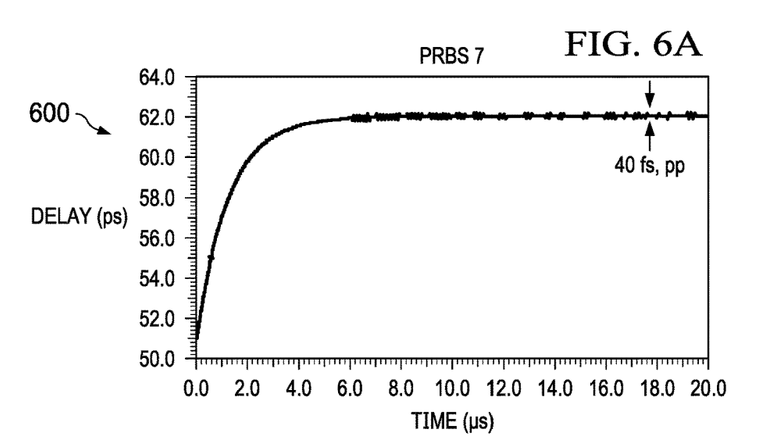
FIGS. 6A and 6B are graphs showing adaptive delay settling in accordance with different examples.
Figure 6B:
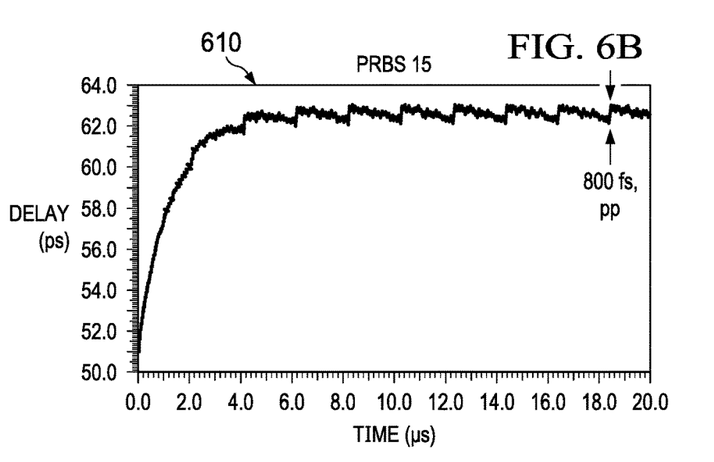

FIG. 5 is a graph 500 showing delay and $V_{ctrl}$ curves in accordance with some examples. In graph 500, an autocorrelation function (e.g., as in FIG. 2 or 4) is used to generate the delay and $V_{ctrl}$ curves. In the example of FIG. 5, the delay curve settles or locks to 2×0.5 UI (~62.5 ps) as $V_{ctrl}$ settles, resulting in a reasonably closed input eye (not shown).

FIGS. 6A, 6B, 7A, and 7B are graphs showing adaptive delay settling in accordance with different examples. In graph 600 of FIG. 6A, a pseudorandom binary sequence (PRBS7) is used to generates a delay curve based on an autocorrelation function, where 10-in FR4 at 16 Gb/s is used. In graph 600, the delay curve settles such that the peak-to-peak variance after about 18 us is 40 fs. In graph 610 of FIG. 6B, a pseudorandom binary sequence (PRBS15) is used to generates a delay curve based on an autocorrelation function, where 10-in FR4 at 16 Gb/s is used. In graph 610, the delay curve settles such that the peak-to-peak variance after about 18 us is 800 fs (longer PRBS run results in more delay jitter/variation. Delay variation in steady state is also a function of the bandwidth (BW) of the delay adaptation loop.

Figure 7A:
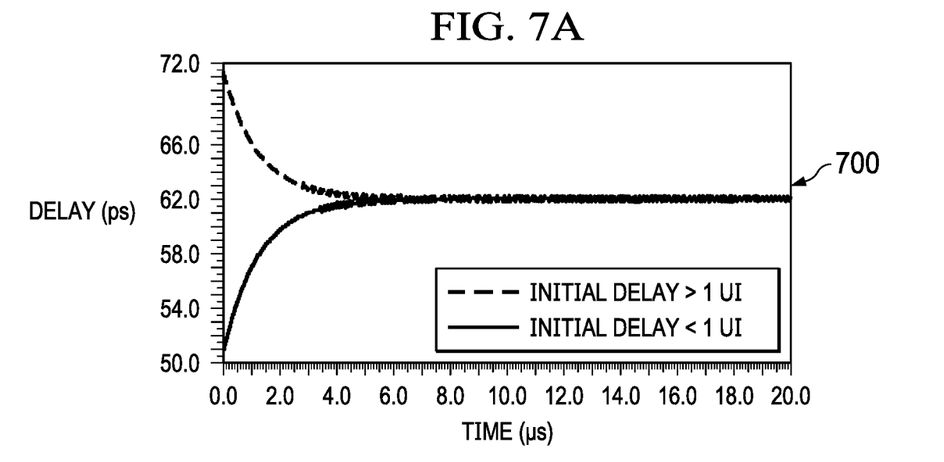
FIGS. 7A and 7B are additional graphs showing adaptive delay settling in accordance with different examples.
Figure 7B:
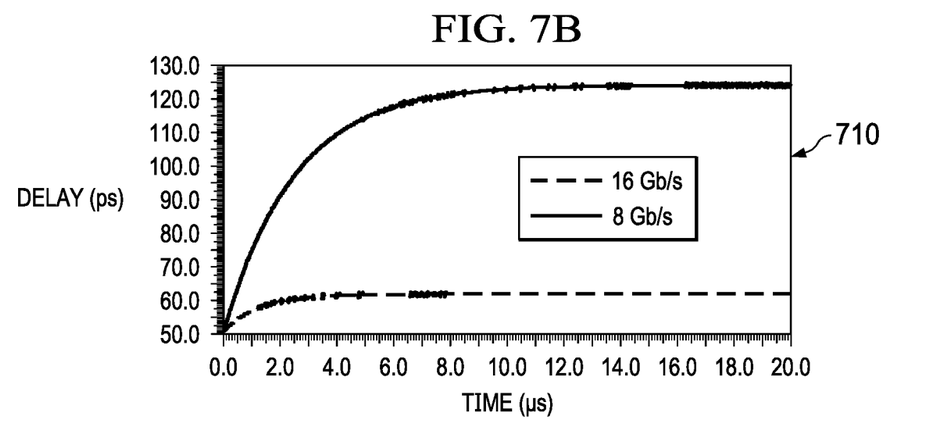

In graph 700 of FIG. 7A, delay curves are represented for initial delays greater than or less than 1 UI, where an autocorrelation function is used to adjust the delay as needed. As represented in graph 700, an autocorrelation function is effective regardless of whether an initial delay is greater than or less than 1 UI (autocorrelation supports bidirectional locking). For the graph 700, PRBS7 and 10-in FR4 at 16 Gb/s is used. In graph 710 of FIG. 7B, different delay curves corresponding to different data rates are represented, where autocorrelation, 10-in FR4 channel and PRBS 7 are used to generate the delay curves. As represented in graph 710, if the delay line has enough range, the proposed autocorrelation function automatically adapts the delay across data rates.

Figure 8:
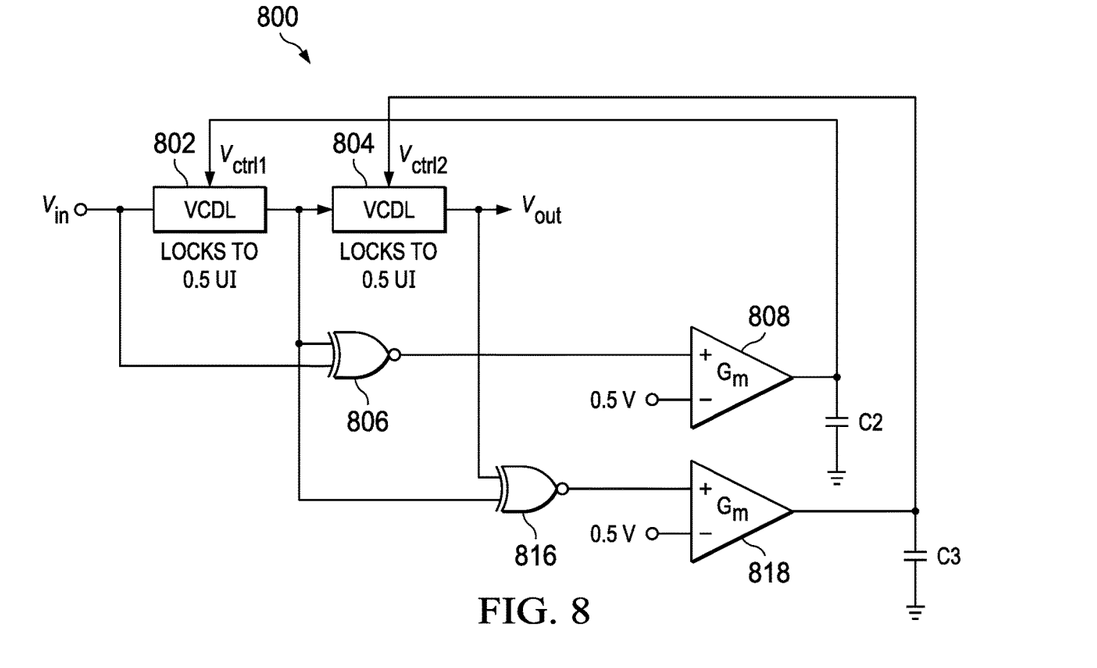
FIGS. 8-10 are diagrams other delay adaptation loops in accordance with some examples.

If delay mismatch of two VCDLs is a concern, independent autocorrelation loops around each VCDL is possible. FIG. 8 is a diagram of a delay adaptation loop 800 with independent autocorrelation loops in accordance with some examples. The delay adaptation loop 800 is an example of the delay adaption loop 204 in FIG. 2, which is part of a clockless DFE. In other examples, the delay adaption loop 800 is used in a clockless FFE, a loss of lock detector, and other such applications across data rates.

As shown, the delay adaptation loop 800 includes a VCDL 802 in series with a VCDL 804, which form a cascaded delay line (e.g., the cascaded delay line 205 in FIG. 2). The delay adaption loop 800 also includes an autocorrelator 806 coupled to the input and output of the VCDL 802. Also, an autocorrelator 816 is coupled to the input and output of the VCDL 804. In the example of FIG. 8, the autocorrelators 806 and 816 are XNOR gates, where the autocorrelator 806 correlates the input and output of the VCDL 802, and where the autocorrelator 816 correlates the input and output of the VCDL 804. In some examples, the average autocorrelator output for the autocorrelator 806 is set to 0.5 using a transconductance stage 808 that subtracts 0.5V from the output of the autocorrelator 806. The output of the transconductance stage 808 is used to charge a capacitor (C2), which determines a control signal ($V_{ctrl}$) for the VCDL 802. Also, the average autocorrelator output for the autocorrelator 816 is set to 0.5 using a transconductance stage 818 that subtracts 0.5V from the output of the autocorrelator 816. The output of the transconductance stage 808 is used to charge a capacitor (C3), which determines a control signal ($V_{ctrl2}$) for the VCDL 804. With $V_{ctrl}$ and $V_{ctrl2}$, the delays for each of the VCDLs 802 and 804 are locked at 0.5 UI (resulting in a total delay of 1 UI for the delay adaptation loop 800 of FIG. 8). In FIG. 8, the autocorrelators 806 and 816, the transconductance stages 808 and 818, C2, and C3 correspond to an autocorrelation control circuit (e.g., the autocorrelation control circuit 206 of FIG. 2).

Figure 9:
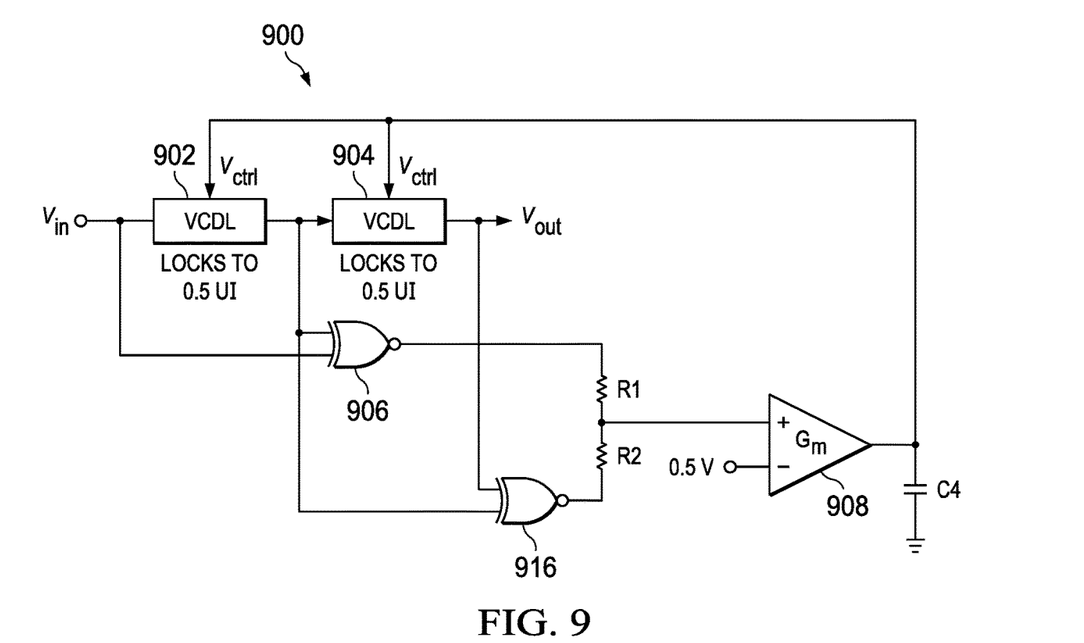

As another option, two autocorrelators are used for the two 0.5 UI delays, where the outputs of the autocorrelators are averaged before going through a Gm stage. FIG. 9 is a diagram of a delay adaptation loop 900 with averaged autocorrelation loops in accordance with some examples. The delay adaptation loop 900 is an example of the delay adaption loop 204 in FIG. 2, which is part of a clockless DFE. In other examples, the delay adaption loop 900 is used in a clockless FFE, a loss of lock detector, and other such applications across data rates.

As shown, the delay adaptation loop 900 includes a VCDL 902 in series with a VCDL 904, which form a cascaded delay line (e.g., the cascaded delay line 205 in FIG. 2). The delay adaption loop 900 also includes an autocorrelator 906 coupled to the input and output of the VCDL 902. Also, an autocorrelator 916 is coupled to the input and output of the VCDL 904. In the example of FIG. 9, the autocorrelators 906 and 916 are XNOR gates, where the autocorrelator 906 correlates the input and output of the VCDL 902, and where the autocorrelator 916 correlates the input and output of the VCDL 904. In the example of FIG. 9, the outputs of the autocorrelators 906 and 916 are combined (averaged) using resistors R1 and R2, where the average autocorrelator outputs for the autocorrelators 906 and 916 is set to 0.5 using a transconductance stage 908 that subtracts 0.5V from the averaged outputs of the autocorrelators 906 and 916. The output of the transconductance stage 908 is used to charge a capacitor (C4), which determines a control signal ($V_{ctrl}$) for the VCDLs 902 and 904. In FIG. 9, the autocorrelators 906 and 916, R1, R2, the transconductance stage 908, and C4 correspond to an autocorrelation control circuit (e.g., the autocorrelation control circuit 206 of FIG. 2). With the delay adaptation loop 900, the loop will lock to a total delay of 1 UI even if each delay line is slightly off from 0.5 UI due to mismatch (e.g., process, temperature, or supply voltage mismatch).

Figure 10:
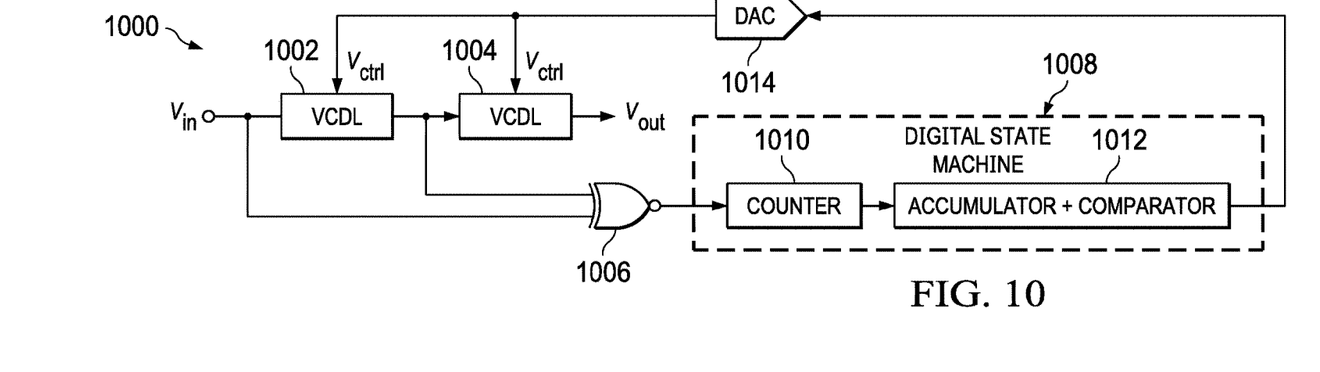

As another option, is some examples, filtering is performed using a digital accumulator/integrator that counts the pulses coming out of the XNOR gate. In such case, the loop is be closed with either a discretely-tuned delay line or a DAC. FIG. 10 is a diagram of a delay adaptation loop 1000 with autocorrelation and a digital state machine in accordance with some examples. The delay adaptation loop 1000 is an example of the delay adaption loop 204 in FIG. 2, which is part of a clockless DFE. In other examples, the delay adaption loop 1000 is used in a clockless FFE, a loss of lock detector, and other such applications across data rates.

As shown, the delay adaptation loop 1000 includes a VCDL 1002 in series with a VCDL 1004, which form a cascaded delay line (e.g., the cascaded delay line 205 in FIG. 2). The delay adaption loop 1000 also includes an autocorrelator 1006 coupled to the input and output of the VCDL 1002. In the example of FIG. 10, the autocorrelator 1006 is a XNOR gate, where the autocorrelator 1006 correlates the input and output of the VCDL 1002. As shown, the output of the autocorrelator 1006 is provided to a digital state machine 1008. In the example of FIG. 10, the digital state machine includes a counter 1010 and an accumulator+ comparator block 1012. The output of the digital state machine 1008 is fed into a DAC 1014, where the output of the DAC 1014 is a control signal ($V_{ctrl}$) for the VCDLs 1002 and 1004. In FIG. 10, the autocorrelator 1006, the digital state matching 1008 and the DAC 1014 correspond to an autocorrelation control circuit (e.g., the autocorrelation control circuit 206 of FIG. 2). With the delay adaptation loop 1000, the loop will lock to a total delay of 1 UI.

Figure 11:
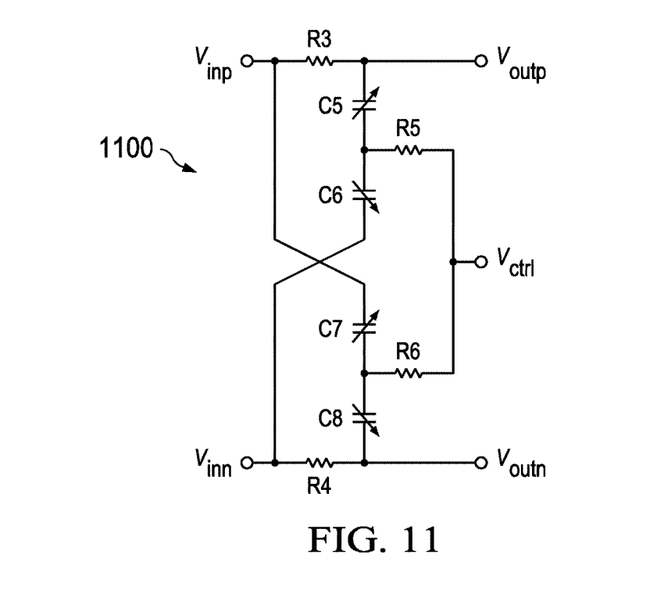
FIG. 11 is a schematic diagram of a voltage-controlled delay line (VCDL) in accordance with some examples.

FIG. 11 is a schematic diagram of a VCDL 1100 (e.g., the VCDLs in FIGS. 2, 4, and 8-10) in accordance with some examples. As shown, the VCDL 1100 includes a positive input node ($V_{inp}$) and a negative input node ($V_{inn}$). The VCDL 1100 also includes resistors (R3-R6) and varactors (C5-C8) in the arrangement shown. Also represented in FIG. 11 is a positive output node ($V_{outp}$), a negative output node ($V_{outn}$), and a control input ($V_{ctrl}$) node. In some examples, the components or arrangement of components of a VCDL vary from what is represented for the VCDL 1100.

Figure 12:
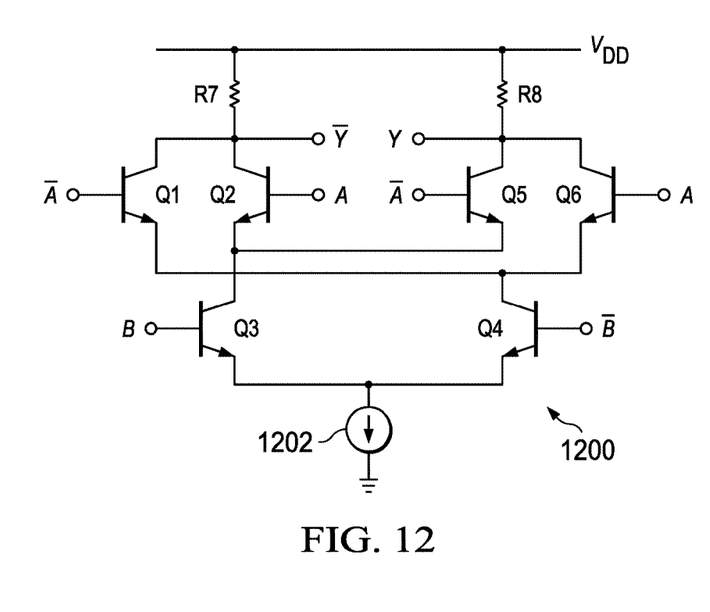
FIG. 12 is a schematic diagram of a current-mode logic (CML) XNOR gate in accordance with some examples.

FIG. 12 is a schematic diagram of a current-mode logic (CML) XNOR gate 1200 (e.g., the autocorrelators in FIGS. 4 and 8-10) in accordance with some examples. As shown, the XNOR gate 1200 includes a positive supply voltage ($V_{DD}$), a ground node, an A node, an $\overline{A}$ input node, a B node, a $\overline{B}$ node, a Y node, and a $\overline{Y}$ node. The CML XNOR gate 1200 also includes resistors (R7 and R8) and various transistors (Q1-Q6) in the arrangement shown. In some examples, the components or arrangement of components for an autocorrelator vary from what is represented for the CML XNOR gate 1200.

Figure 13:
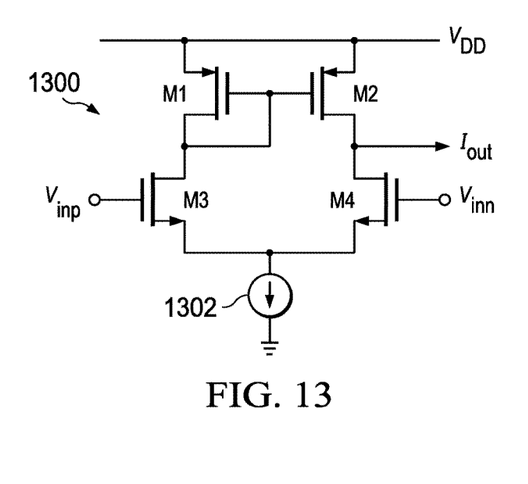
FIG. 13 is a schematic diagram of a transconductance ($G_m$) stage in accordance with some examples.

FIG. 13 is a schematic diagram of a transconductance ($G_m$) stage 1300 (e.g., the transconductance stages in FIGS. 4, 8, and 9) in accordance with some examples. As shown, the transconductance stage 1300 includes a positive supply voltage ($V_{DD}$), a ground node, a positive input node ($V_{inp}$), a negative input node ($V_{inn}$), and an output current ($I_{out}$) node. The transconductance stage 1300 also various transistors (M1-M4) in the arrangement shown. In some examples, the components or arrangement of components for a transconductance stage vary from what is represented for the transconductance stage 1300.

In the proposed delay adaption loop topologies, an autocorrelation function is used. The autocorrelation function of a random data stream decreases monotonically as the time shift is increased from zero, and goes to zero when the time shift reaches and exceeds 1 UI. In some examples, XNOR (or XOR) gates with the input data and its delayed version as inputs are used to generate this autocorrelation function, and a control loop around this XNOR gate drives the delay towards 1 UI while driving the autocorrelation function to zero. In the presence of ISI, the autocorrelation function may have a non-zero tail that exceeds time shift of 1 UI. So instead of locking to 1 UI, it is more robust to lock to 0.5 UI by forcing the autocorrelation function towards 0.5 (instead of 0). These 0.5 UI delay elements could then be cascaded to generate the 1 UI delay. With the proposed delay adaption loop topologies, calibrated delays are created for random data without the need of a clock in the system (and maintains the delay despite voltage and temperature variations). The proposed delay adaptation loop topologies enables the design of adaptive delay lines for clockless DFEs, clockless FFEs, loss of lock detectors, and other such applications across data rates. With the proposed delay adaptation loop topologies no clock is used, and the solution can be generalized to create fractional delays. Also, the solution is scalable across data rates, such that automatic adaptation to the desired delay is possible despite voltage and temperature variations.

In some examples, an apparatus (e.g., an integrated circuit, chip, or circuit corresponding to a linear repeater or redriver with a clockless DFE, a clockless FFE, a loss of lock detector, or other such circuit that adapts to different data rates) includes a clockless delay adaptation loop configured to adapt to random data. The apparatus includes a circuit (e.g., a clockless DFE, a clockless FFE, a loss of lock detector, or other such circuit that adapts to different data rates) coupled to the clockless delay adaptation loop. The clockless delay adaptation loop includes a cascaded delay line (e.g., the cascaded delay line 205 of FIG. 2, or VCDLs in FIGS. 4 and 8-10) and an autocorrelation control circuit (e.g., the autocorrelation control circuit 206 in FIG. 2) coupled to the cascaded delay line, wherein an output of the autocorrelation control circuit is used to generate a control signal (e.g., $V_{ctrl}$, $V_{ctrl1}$, $V_{ctrl2}$) for the cascaded delay line.

In some examples, the cascaded delay line comprises a VCDL (e.g., the VCDLs in FIGS. 4 and 8-10) and the autocorrelation control circuit comprises a XNOR gate (e.g., the XNOR gates in FIGS. 4 and 8-10). In some examples, the autocorrelation control circuit also includes a transconductance stage (e.g., the transconductance stages in FIGS. 4, 8, and 9) coupled to an output of the autocorrelation control circuit. In some examples, the autocorrelation control circuit also includes a capacitor (e.g., the capacitors in FIGS. 4, 8, and 9) with a first plate coupled to an output of the transconductance stage and with a second plate coupled to a ground node, wherein the output of the transconductance stage is the control signal, and wherein the control signal locks the clockless delay adaptation loop to a delay value of 1 UI. In some examples, the autocorrelation control circuit also includes a digital state machine (e.g., the digital state machine 1008 of FIG. 10) coupled to an output of the autocorrelation control circuit. In some examples, the autocorrelation control circuit includes a DAC (e.g., the DAC 1014 in FIG. 10) coupled to an output of the digital state machine, where an output of the DAC is the control signal, and where the control signal locks the clockless delay adaptation loop to a delay value of 1 UI.

In some examples, the cascaded delay line comprises a first delay line (e.g., VCDL 402 in FIG. 4) and a second delay line (e.g., VCDL 404 in FIG. 4) in series, wherein each of the first and second delay lines comprises a control input node, and wherein the output of the autocorrelation control circuit is used to generate a control signal (e.g., $V_{ctrl}$ in FIG. 4) input to the respective control input nodes of the first and second delay lines.

In some examples, the cascaded delay line comprises a first delay line (e.g., VCDL 802 in FIG. 8) and a second delay line (e.g., VCDL 804 in FIG. 8) in series, wherein each of the first and second delay lines comprises a control input node, wherein the autocorrelation control circuit comprises a first autocorrelator (e.g., XNOR gate 806 in FIG. 8) associated with the first delay line, and wherein an output of the first autocorrelator is used to generate a control signal (e.g., $V_{ctrl}$ in FIG. 8) input to the control input node of the first delay line. In some examples, the autocorrelation control circuit also includes a second autocorrelator (e.g., XNOR gate 816 in FIG. 8) associated with the second delay line, wherein an output of the second autocorrelator is used to generate a control signal (e.g., $V_{ctrl2}$ in FIG. 8) input to the control input node of the second delay line.

In some examples, the cascaded delay line comprises a first delay line (e.g., VCDL 902 in FIG. 9) and a second delay line (e.g., VCDL 904 in FIG. 9) in series, wherein each of the first and second delay lines comprises a control input node, wherein the autocorrelation control circuit comprises a first autocorrelator (e.g., XNOR gate 906 in FIG. 9) associated with the first delay line. In some examples, the autocorrelation control circuit also includes a second autocorrelator (e.g., XNOR gate 916 in FIG. 9) associated with the second delay line, wherein an average output of the first and second autocorrelators is used to generate a control signal (e.g., $V_{ctrl}$ in FIG. 9) input to the control input nodes of the first and second delay lines.

In some examples, a clockless DFE (e.g., the clock DFE 200 in FIG. 2) includes a summation circuit (e.g., the summation circuit 208 in FIG. 2) configured to provide an output signal (e.g., $V_{out}$ in FIG. 2) by combining an input signal (e.g., $V_{in}$ in FIG. 2) and a feedback signal (e.g., the feedback signal 216 in FIG. 2). The clockless DFE also includes a DFE feedback path (e.g., the DFE feedback path 203 in FIG. 2) configured to receive the output signal and provide the feedback signal, wherein the DFE feedback path includes a delay adaptation loop (e.g., any of the delay adaptation loops of FIGS. 2, 4, and 8-10) configured to adapt to random data. The delay adaption loop includes a VCDL (e.g., the VCDLs in FIGS. 4 and 8-10) with a data input node, a data output node, and a control input node. The delay adaptation loop also includes an autocorrelator (e.g., the XNOR gates in FIGS. 4 and 8-10) coupled to the data input node and the data output node, wherein an output of the autocorrelator is used to generate a control signal (e.g., $V_{ctrl}$, $V_{ctrl1}$, $V_{ctrl2}$) input to the control input node. The delay adaptation loop also includes a DFE tap circuit (see e.g., FIG. 1) in series with the VCDL.

In some examples, the autocorrelator is a XNOR gate, and the delay adaptation loop also includes a transconductance stage (e.g., the transconductance stages in FIGS. 4, 8, and 9) coupled to an output of the autocorrelator. In some examples, the delay adaptation loop includes a capacitor (e.g., the capacitors in FIGS. 4, 8, and 9) with a first plate coupled to an output of the transconductance stage and with a second plate coupled to a ground node, wherein the output of the transconductance stage is the control signal, and wherein the control signal locks the delay line to a delay value of 1 UI. In some examples, the clockless delay adaptation loop includes a digital state machine (e.g., the digital state machine 1008 of FIG. 10) coupled to an output of the autocorrelator. In some examples, the clockless delay adaptation loop includes a DAC (e.g., the DAC 1014 in FIG. 10) coupled to an output of the digital state machine, where an output of the DAC is the control signal, and where the control signal locks the delay line to a delay value of 1 UI.

In some examples, the delay adaptation loop comprises a single VCDL corresponding to the VCDL. In other examples, the VCDL is a first VCDL (e.g., VCDL 802 in FIG. 8) and wherein the delay adaptation loop comprises a second VCDL (e.g., VCDL 804 in FIG. 8) in series with the first VCDL, wherein each of the first and second VCDLs have a control input node, wherein the autocorrelator is a first autocorrelator (e.g., XNOR gate 806 in FIG. 8) associated with the first VCDL, and wherein an output of the first autocorrelator is used to generate a control signal input (e.g., Vctrl1 in FIG. 8) to the control input node of the first VCDL. In such examples, the delay adaptation loop also includes a second autocorrelator (e.g., XNOR gate 816 in FIG. 8) associated with the second VCDL, wherein an output of the second autocorrelator is used to generate a control signal input (e.g., Vctrl2 in FIG. 8) to the control input node of the second VCDL.

In some examples, the VCDL is a first VCDL (e.g., VCDL 902 in FIG. 9) and wherein the delay adaptation loop comprises a second VCDL (e.g., VCDL 904 in FIG. 9) in series with the first VCDL, wherein each of the first and second VCDLs have a control input node, wherein the autocorrelator is a first autocorrelator (e.g., XNOR gate 906 in FIG. 9) associated with the first VCDL. In such examples, the clockless delay adaptation loop also includes a second autocorrelator (e.g., XNOR gate 916 in FIG. 9) associated with the second VCDL, wherein an average output of the first and second autocorrelators is used to generate a control signal (e.g., Vctrl in FIG. 9) input to the control input nodes of the first and second VCDLs.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. An apparatus that comprises:
    a delay adaptation loop configured to adapt to random data; and
    a circuit coupled to the delay adaptation loop, wherein the delay adaptation loop comprises:
        a cascaded delay line; and
        an autocorrelation control circuit coupled to the cascaded delay line, wherein an output of the autocorrelation control circuit is used to generate a control signal for the cascaded delay line.

2. The apparatus of claim 1, wherein the circuit comprises a decision-feedback equalizer (DFE).

3. The apparatus of claim 1, wherein the circuit comprises a loss of lock detector.

4. The apparatus of claim 1, wherein the cascaded delay line comprises a first delay line and a second delay line in series, wherein each of the first and second delay lines comprises a control input node, and wherein the output of the autocorrelation control circuit is used to generate a control signal input to the respective control input nodes of the first and second delay lines.

5. The apparatus of claim 1, wherein the cascaded delay line comprises a first delay line and a second delay line in series, wherein each of the first and second delay lines comprises a control input node, and wherein the autocorrelation control circuit comprises:
- a first autocorrelator associated with the first delay line, and wherein an output of the first autocorrelator is used to generate a control signal input to the control input node of the first delay line; and
- a second autocorrelator associated with the second delay line, wherein an output of the second autocorrelator is used to generate a control signal input to the control input node of the second delay line.

6. The apparatus of claim 1, wherein the cascaded delay line comprises a first delay line and a second delay line in series, wherein each of the first and second delay lines comprises a control input node, and wherein the autocorrelation control circuit comprises:
- a first autocorrelator associated with the first delay line;
- a second autocorrelator associated with the second delay line, wherein an average output of the first and second autocorrelators is used to generate a control signal input to the control input nodes of the first and second delay lines.

7. A decision-feedback equalizer (DFE), comprising:
- a summation circuit configured to provide an output signal by combining an input signal and a feedback signal; and
- a DFE feedback path configured to receive the output signal and provide the feedback signal, wherein the DFE feedback path includes a delay adaptation loop configured to adapt to random data, and wherein the delay adaption loop comprises:
  - a voltage-controlled delay line (VCDL) with a data input node, a data output node, and a control input node;
  - an autocorrelator coupled to the data input node and the data output node, wherein an output of the autocorrelator is used to generate a control signal input to the control input node; and
  - a DFE tap circuit in series with the VCDL.

8. The DFE of claim 7, wherein the delay adaptation loop comprises a single VCDL corresponding to the VCDL.

9. The DFE of claim 7, wherein the VCDL is a first VCDL and wherein the delay adaptation loop comprises a second VCDL in series with the first VCDL, wherein each of the first and second VCDLs have a control input node, wherein the autocorrelator is a first autocorrelator associated with the first VCDL, and wherein an output of the first autocorrelator is used to generate a control signal input to the control input node of the first VCDL, and wherein the delay adaptation loop further comprises:
- a second autocorrelator associated with the second VCDL, wherein an output of the second autocorrelator is used to generate a control signal input to the control input node of the second VCDL.

10. The DFE of claim 7, wherein the VCDL is a first VCDL and wherein the delay adaptation loop comprises a second VCDL in series with the first VCDL, wherein each of the first and second VCDLs have a control input node, wherein the autocorrelator is a first autocorrelator associated with the first VCDL, and wherein the delay adaptation loop further comprises:
- a second autocorrelator associated with the second VCDL, wherein an average output of the first and second autocorrelators is used to generate a control signal input to the control input nodes of the first and second VCDLs.

11. A delay adaptation loop, comprising:
- a first delay line;
- a second delay line;
- an autocorrelation control circuit coupled to the first delay line and the second delay line, wherein the autocorrelation control circuit provides a control signal to each of the first and second delay lines based on an autocorrelation function applied to input data and output data of at least one of the first and second delay lines.

\* \* \* \* \*